(12) United States Patent
Gu et al.

(10) Patent No.: US 9,209,131 B2
(45) Date of Patent: Dec. 8, 2015

(54) TOROID INDUCTOR IN REDISTRIBUTION LAYERS (RDL) OF AN INTEGRATED DEVICE

(71) Applicant: QUALCOMM Incorporated, San Diego, CA (US)

(72) Inventors: Shiqun Gu, San Diego, CA (US); Ryan David Lane, San Diego, CA (US); Urmi Ray, Ramona, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/160,448

(22) Filed: Jan. 21, 2014

(65) Prior Publication Data

US 2015/0206837 A1     Jul. 23, 2015

(51) Int. Cl.
*H01L 23/485* (2006.01)
*H01L 23/522* (2006.01)
*H01L 21/768* (2006.01)
*H01L 49/02* (2006.01)
*H01L 23/538* (2006.01)

(52) U.S. Cl.
CPC ...... *H01L 23/5227* (2013.01); *H01L 21/76838* (2013.01); *H01L 23/5389* (2013.01); *H01L 28/10* (2013.01); *H01L 23/5383* (2013.01); *H01L 2224/11* (2013.01); *H01L 2224/18* (2013.01); *H01L 2924/0002* (2013.01)

(58) Field of Classification Search
CPC .............. H01L 23/3192; H01L 23/642; H01L 2924/0105; H01L 2924/01011
USPC ................................... 257/528, 532; 438/622
See application file for complete search history.

(56) References Cited

U.S. PATENT DOCUMENTS

| | | | |
|---|---|---|---|
| 6,008,102 A | 12/1999 | Alford et al. | |
| 6,255,714 B1 | 7/2001 | Kossives et al. | |
| 7,436,683 B2 | 10/2008 | Shen | |
| 8,445,990 B2 | 5/2013 | Lin et al. | |
| 8,513,812 B2 | 8/2013 | Lin | |
| 2012/0161279 A1 | 6/2012 | Lin et al. | |
| 2012/0175779 A1* | 7/2012 | Lin | ............................... 257/773 |
| 2013/0001742 A1 | 1/2013 | Nakashiba | |

OTHER PUBLICATIONS

International Search Report and Written Opinion—PCT/US2015/012090—ISA/EPO—Apr. 14, 2015.

* cited by examiner

*Primary Examiner* — Evan Pert
*Assistant Examiner* — Changhyun Yi
(74) *Attorney, Agent, or Firm* — Loza & Loza, LLP

(57) ABSTRACT

Some features pertain to an integrated device that includes a substrate, several metal layers coupled to the substrate, several dielectric layers coupled to the substrate, a first metal redistribution layer coupled to one of the metal layers, and a second metal redistribution layer coupled to the first metal redistribution layer. The first and second metal redistribution layers are configured to operate as a toroid inductor in the integrated device. In some implementations, the integrated device also includes a third metal redistribution layer. The third metal redistribution layer is coupled to the first and second metal redistribution layers. The third metal redistribution layer is a via. In some implementations, the first, second, and third metal redistribution layers are configured to operate as a toroid inductor in the integrated device. In some implementations, the first, second, and third redistribution layers form a set of windings for the toroid inductor.

20 Claims, 16 Drawing Sheets

TOROID INDUCTOR IN REDISTRIBUTION LAYERS (RDL) OF AN INTEGRATED DEVICE

BACKGROUND

1. Field

Various features relate to a toroid inductor in redistribution layers of an integrated device.

2. Background

A typical die is manufactured by depositing several metal layers and several dielectric layers on top of a substrate. The die is manufactured by using a wafer level packaging (WLP) process. FIG. 1 illustrates a side view of a wafer. Specifically, FIG. 1 illustrates a side view of a portion of a wafer 100. The wafer 100 includes several metal and dielectric layers 102, a pad 104, a passivation layer 106, a first insulation layer 108, a first metal layer 110, a second insulation layer 112, and an under bump metallization (UBM) layer 114. FIG. 1 also illustrates a solder ball 116 on the wafer 100. Specifically, the solder ball 116 is coupled to the UBM layer 114. The pad 104, the first metal layer 110 and the UBM layer 114 are a conductive material (e.g., copper). The first insulation layer 108 and the second insulation layer 112 are polyimide layers (PI), Polybenzoxazole (PBO) or other polymer layers used for repassivation.

In some electronic designs, an inductor may be required. In a traditional electronic design, the inductor may be placed outside of the package. For example, the package that includes a die may be coupled to a printed circuit board (PCB). An inductor may be coupled to the PCB. Thus, the inductor may be coupled to the package that includes a die through the PCB. One downside of this approach is that the inductor may be far away from die. In some instance, it may be ideal and/or optimal to have the inductor as close as possible to the die. For instance, it may be ideal and/or optimal to have the inductor coupled to the die and/or die package, while at the same time bypassing a PCB. In some implementations, it may be desirable to put an inductor in the metal and dielectric layers of the die. However, such a solution would increase the Si die area as the inductor may cause electromagnetic interference with the active elements and/or circuits of the die.

Therefore, there is a need for a design that provides an inductor (e.g., toroid inductor) in an integrated device (e.g., a die, die package).

SUMMARY

Various features, apparatus and methods described herein provide a toroid inductor in redistribution layers of an integrated device.

A first example provides an integrated device that includes a substrate, several metal layers coupled to the substrate, several dielectric layers coupled to the substrate, a first metal redistribution layer coupled to one of the metal layers, and a second metal redistribution layer coupled to the first metal redistribution layer. The first and second metal redistribution layers are configured to operate as a toroid inductor in the integrated device.

According to an aspect, the redistribution portion includes a third metal redistribution layer, where the third metal redistribution layer is coupled to the first and second metal redistribution layers. The third metal redistribution layer is a via. In some implementations, the first, second, and third metal redistribution layers are configured to operate as a toroid inductor in the integrated device. In some implementations, the first, second, and third redistribution layers form a set of windings for the toroid inductor.

According to one aspect, the redistribution portion further includes a first dielectric layer, and a second dielectric layer. In some implementations, the second metal redistribution layer is on a surface of the integrated device.

According to an aspect, the integrated device further includes a first die coupled to the substrate. In some implementations, the redistribution portion is coupled to the first die and the substrate.

According to one aspect, the integrated device is one of at least a die and/or a die package.

According to an aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an apparatus that includes a substrate, several metal layers coupled to the substrate, several dielectric layers coupled to the substrate, and a redistribution portion coupled to one of the metal layers. The redistribution portion includes a first interconnect means, and a second interconnect means coupled to the first interconnect means, where the first and second metal interconnect means are configured to operate as a toroid inductor in the apparatus.

According to an aspect, the redistribution portion further includes a third interconnect means, where the third interconnect means is coupled to the first and second interconnect means, the third interconnect means being a via. In some implementations, the first, second, and third interconnect means are configured to operate as a toroid inductor in the apparatus. In some implementations, the first, second, and third interconnect means form a set of windings for the toroid inductor.

According to one aspect, the redistribution portion further includes a first dielectric layer, and a second dielectric layer. In some implementations, the second interconnect means is on a surface of the apparatus.

According to an aspect, the apparatus further includes a first die coupled to the substrate.

According to one aspect, the redistribution portion is coupled to the first die and the substrate.

According to an aspect, the apparatus is one of at least an integrated device, and/or a die package.

According to one aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a method for providing an integrated device that includes a toroid inductor. The method provides a substrate. The method provides several metal layers coupled to the substrate. The method provides several dielectric layers coupled to the substrate. The method couples a redistribution portion to one of the metal layers, where coupling the redistribution portion includes providing a first metal redistribution layer, and providing a second metal redistribution layer coupled to the first metal redistribution layer.

According to an aspect, coupling the redistribution portion further includes providing a third metal redistribution layer such that the third metal redistribution layer is coupled to the first and second metal redistribution layers, the third metal redistribution layer being a via. In some implementations, the first, second, and third metal redistribution layers are configured to operate as a toroid inductor in the integrated device. In some implementations, the first, second, and third redistribution layers form a set of windings for the toroid inductor.

According to one aspect, coupling the redistribution portion further includes providing a first dielectric layer, and providing a second dielectric layer. In some implementations, the second metal redistribution layer is on a surface of the integrated device.

According to an aspect, the method further includes coupling a first die to the substrate. In some implementations, the redistribution portion is coupled to the first die and the substrate.

According to one aspect, the integrated device is one of at least a die and/or a die package.

According to an aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to an integrated device (e.g., die, die package) that includes a substrate, several metal layers coupled to the substrate, several dielectric layers coupled to the substrate, a first metal redistribution layer coupled to one of the metal layers, and a second metal redistribution layer coupled to the first metal redistribution layer. The first and second metal redistribution layers are configured to operate as a toroid inductor in the integrated device. In some implementations, the integrated device also includes a third metal redistribution layer. The third metal redistribution layer is coupled to the first and second metal redistribution layers. The third metal redistribution layer is a via. In some implementations, the first, second, and third metal redistribution layers are configured to operate as a toroid inductor in the integrated device. In some implementations, the first, second, and third redistribution layers form a set of windings for the toroid inductor. In some implementations, the integrated device further includes a redistribution portion. The redistribution portion includes the first metal redistribution layer, the second metal redistribution layer, a first dielectric layer, and a second dielectric layer. In some implementations, the second metal redistribution layer is on a surface of the integrated device. In some implementations, the integrated device includes a first die coupled to the substrate. In some implementations, the toroid inductor is in a redistribution portion of the integrated device. The redistribution portion is coupled to the first die and the substrate.

Exemplary Toroid Inductor in an Integrated Device

Figure 1:
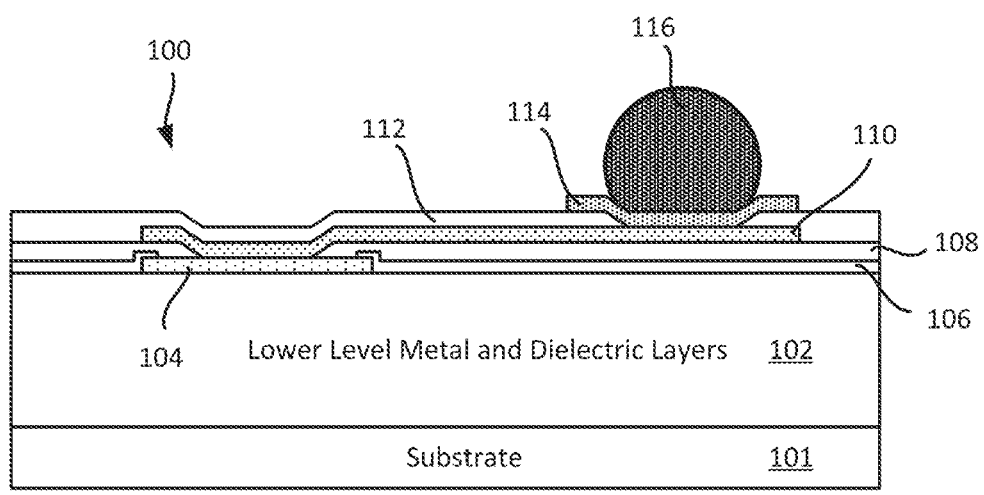
FIG. 1 illustrates a profile view of a conventional die.
Figure 2:
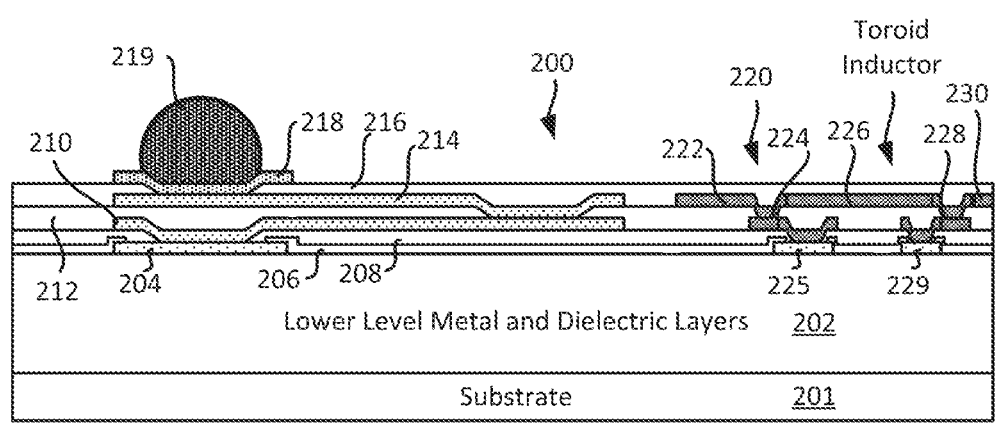
FIG. 2 illustrates an example of an integrated device that includes a toroid inductor.

FIG. 2 conceptually illustrates an example of a side view of an inductor (e.g., toroid inductor) in an integrated device (e.g., semiconductor device, die, die package). Specifically, FIG. 2 illustrates an integrated device 200 (e.g., die, die package) that includes a substrate 201, several lower level metal layers and dielectric layers 202, a first pad 204, a second pad 225, a third pad 229, a passivation layer 206, a first insulation layer 208 (e.g., first dielectric layer), a first redistribution layer 210, a second insulation layer 212 (e.g., second dielectric layer), a second redistribution layer 214, a third insulation layer 216 (e.g., third dielectric layer), and an under bump metallization (UBM) layer 218. In some implementations, the first pad 204, a second pad 225, a third pad 229, the passivation layer 206, the first insulation layer 208 (e.g., first dielectric layer), the first redistribution layer 210, the second insulation layer 212 (e.g., second dielectric layer), the second redistribution layer 214, the third insulation layer 216 (e.g., third dielectric layer), and the under bump metallization (UBM) layer 218 are part of a redistribution portion of the integrated device 200. Different implementations may have different numbers of redistribution metal layers (e.g., 1, 2 or more metal layers).

FIG. 2 also illustrates a solder ball 219 coupled to the UBM layer 218. In some implementations, the solder ball 219 may be coupled to the redistribution layer (e.g., redistribution layer 214). The first and second redistribution layers 210 and 214 may be conductive layers (e.g., metal layer, copper layer) in some implementations. The substrate 201 may be one of at least silicon, glass, ceramic, and/or dielectric. In some implementations, the metal layers of the lower level metal layers and dielectric layers 202 are configured to provide one or more electrical paths (e.g., routes, interconnects) to one or more circuit elements (not shown) in the integrated device 200.

FIG. 2 also illustrates the integrated device 200 includes a toroid inductor 220. In some implementations, the toroid inductor 220 includes several interconnects that define a set of windings for the toroid inductor 220. As shown in FIG. 2 the toroid inductor 220 includes a first interconnect 222, a second set of interconnects 224, a third interconnect 226, a fourth set of interconnects 228, and a fifth interconnect 230. In some implementations the second set of interconnects 224 includes a set of traces and vias (e.g., a first via, a first trace, and a second via). Similarly, in some implementations, the fourth set of interconnects 228 includes a set of traces and vias. (e.g., a third via, a second trace, and a fourth via).

In some implementations, the second set of interconnects 224 and the fourth set of interconnects 228 are part of a first redistribution layer (e.g., redistribution layer 210). In some implementations, the first interconnect 222, the third interconnect 226, and the fifth interconnect 230 are part of a second redistribution layer (e.g., redistribution layer 210).

In some implementations, the first interconnect 222, the second set of interconnects 224, the third interconnect 226, the fourth set of interconnects 228, and the fifth interconnect 230 are configured to form a set of windings for the toroid inductor 220. In particular, in some implementations, the first interconnect 222, the second set of interconnects 224, the third interconnect 226, the fourth set of interconnects 228, and the fifth interconnect 230 are configured to operate as a toroid inductor. The toroid inductor 220 is coupled to the second pad 225 and the third pad 229. As shown in FIG. 2, the toroid inductor 220 is part of the redistribution portion of the integrated device 200. An example of a shape and a configuration of a toroid inductor is further described in FIG. 3.

FIG. 2 illustrates that the toroid inductor 220 is positioned and located in the redistribution layers of the integrated device 200 (e.g., outside of the lower level metal layers and dielectric layers 202). In some implementations, the first interconnect 222, some of the second set of interconnects 224, the third interconnect 226, some of the fourth set of interconnects 228, and the fifth interconnect 230 are part of the second redistribution layer 214. In some implementations, some of the second set of interconnects 224, and some of the fourth set of interconnects 228 are part of the first redistribution layer 210. However, it should be noted that the position and/or the location of the toroid inductor 220 in the integrated device 200 shown in FIG. 2 is merely exemplary and the toroid inductor 220 may be positioned and/or located in different portions of the redistribution layers of the integrated device 200. For example, in some implementations, there may be more than two redistribution layers (e.g., first redistribution layer, second redistribution layer, third redistribution layer). In such instances, the toroid inductor may be positioned and/or located in any of the redistribution layers. Moreover, in some implementations, there may be more than one toroid inductor, or there may be different types and/or combinations of inductors in the redistribution layers of the integrated device 200.

Figure 3:
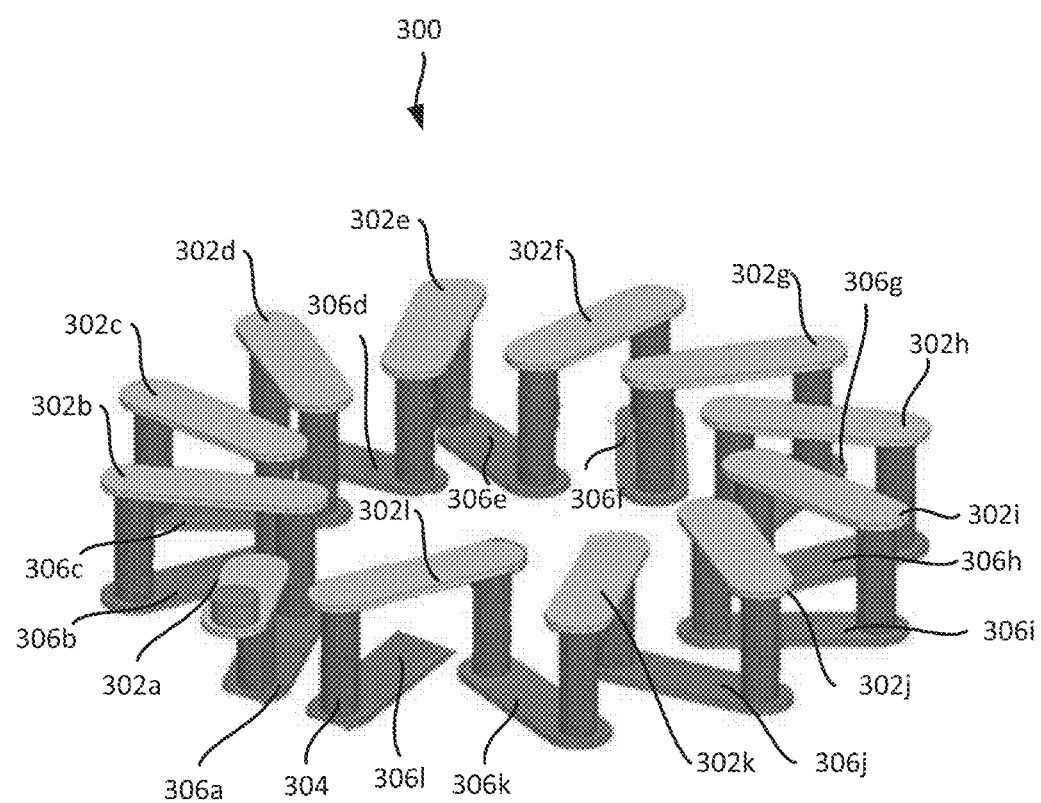
FIG. 3 illustrates an example of an abstract representation of a toroid inductor.

FIG. 3 conceptually illustrates an abstract representation of an angled view of an example of a toroid inductor 300. In some implementations, the toroid inductor 220 of FIG. 2 may be configured in the integrated device 200 to have a similar configuration as the toroid inductor 300 of FIG. 3.

As shown in FIG. 3, the toroid inductor 300 includes a set of windings. In some implementations, the set of windings form a circular ring shape (or near circular ring shape) structure/configuration. However, different implementations may have different shapes. Specifically, the toroid inductor 300 includes a first set of interconnects 302 (e.g., 302a-302l), a set of vias 304, and a second set of interconnects 306 (e.g., 306a-306l). In some implementations, the set of vias 304 may include one via or may include several vias (e.g., stack of vias). In some implementations, the first set of interconnects 302, the set of vias 304, and the second set of interconnects 306 form the set of windings for the toroid inductor 300. In some implementations, the first set of interconnects 302, the set of vias 304, and the second set of interconnects 306 are configured to operate as a toroid inductor. In some implementations, the first set of interconnects 302 are on a first plane (e.g., top plane, top metal layer). In some implementations, the second set of interconnects 306 are on a second plane (e.g., bottom plane, bottom metal layer).

As further shown in FIG. 3, the first set of interconnects 302 includes several first interconnects (e.g., 302a-302l). The set of vias 304 includes several vias (e.g., 304a-304l). It should be noted that the set of vias may also include a set of traces. That is, in some implementations, the set of vias 304 is not entirely vertical. In some implementations, the set of vias 304 may be configured to include vias and traces. The second set of interconnects 306 includes several second interconnects (e.g., 306a-306l). FIG. 3 illustrates that a first interconnect (e.g., from the first set of interconnects 302) on a first plane is coupled to a first via. The first via is coupled to a second interconnect (e.g., from the second set of interconnects 306) on a second plane. The second interconnect is coupled to a second via. The second via is coupled to a third interconnect (e.g., from the first set of interconnects 302) on the first plane. The third interconnect is coupled to a third via. The third via is coupled to a fourth interconnect (e.g., from the second set of interconnects 306) on the second plane.

In some implementations, the toroid inductor 300 may be provided in an integrated device. In particular, in some implementations, the toroid inductor 300 may be provided in one or more redistribution layers of an integrated device. For example, the toroid inductor 300 may be provided in the redistribution layers 210 and 214 of the integrated device 200. In such instances, the first set of interconnects 302 may correspond to the first interconnect 222 and the fifth interconnect 230. The set of vias 304 may correspond to the second set of interconnects 224 (which includes vias and trace(s)) and the fourth set of interconnects 228. In some implementations, the second set of interconnects 306 may correspond to some of the traces from the second set of interconnects 224, and/or some of the traces from the fourth set of interconnects 228.

The toroid inductor 300 includes two terminals (e.g., pins). Different implementations may provide the terminals in different locations. In some implementations, a first terminal of the toroid inductor is located in a top level interconnect (e.g., interconnect 302), and a second terminal of the toroid inductor is located in a bottom level interconnect (e.g., interconnect 306). In some implementations, a first terminal of the toroid inductor is located in a first top level interconnect (e.g., interconnect 302a), and a second terminal of the toroid inductor is located in a second top level interconnect (e.g., interconnect 302l). In some implementations, a first terminal of the toroid inductor is located in a first bottom level interconnect (e.g., interconnect 306a), and a second terminal of the toroid inductor is located in a second bottom level interconnect (e.g., interconnect 306l).

It should be noted that the toroid inductor 300 shown in FIG. 3 is an abstract representation of a toroid inductor. In some implementations, a toroid inductor in an integrated device (e.g., integrated device 200) may look different than what is depicted in FIG. 3.

In some implementations, an integrated device may have a different configuration than the integrated device 200 shown in FIG. 2. For example, in some implementations, an integrated device may include several dies. In such instances, a toroid inductor may still be provided in the integrated device.

In some implementations, the toroid inductor may be positioned and/or located differently in and/or on the dielectric layer of an integrated device. For example, in some implementations, part of the toroid inductor may be on the surface of the dielectric layer of an integrated device.

Figure 4:
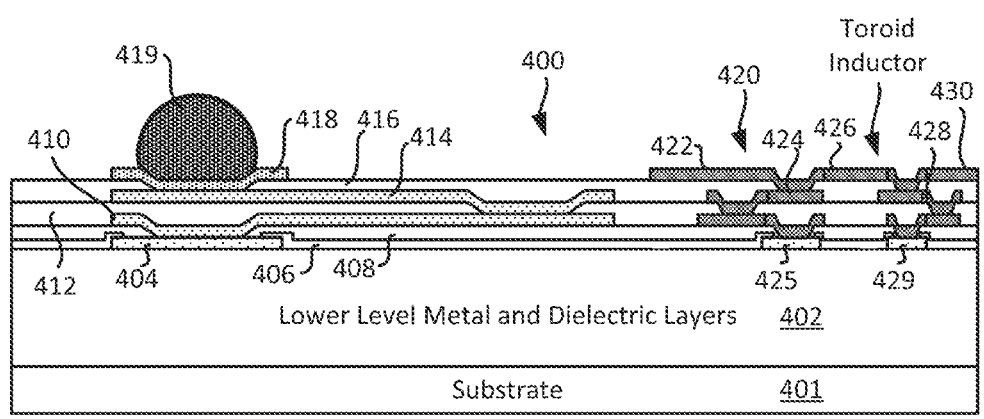
FIG. 4 illustrates another example of an integrated device that includes a toroid inductor.

FIG. 4 conceptually illustrates an example of a side view of an inductor (e.g., toroid inductor) in an integrated device (e.g., semiconductor device, die, die package). Specifically, FIG. 4 illustrates a integrated device 400 (e.g., die, die package) that includes a substrate 401, several lower level metal layers and dielectric layers 402, a first pad 404, a second pad 425, a third pad 429, a passivation layer 406, a first insulation layer 408 (e.g., first dielectric layer), a first redistribution layer 410, a second insulation layer 412 (e.g., second dielectric layer), a second redistribution layer 414, a third insulation layer 416 (e.g., third dielectric layer), and an under bump metallization (UBM) layer 418. In some implementations, the first pad 404, a second pad 425, a third pad 429, the passivation layer 406, the first insulation layer 408 (e.g., first dielectric layer), the first redistribution layer 410, the second insulation layer 412 (e.g., second dielectric layer), the second redistribution layer 414, the third insulation layer 416 (e.g., third dielectric layer), and the under bump metallization (UBM) layer 418 are part of a redistribution portion of the integrated device 400. Different implementations may have different number of redistribution metal layers (e.g., 1, 2 or more metal layers).

FIG. 4 also illustrates a solder ball 419 coupled to the UBM layer 418. The first and second redistribution layers 410 and 414 may be conductive layers (e.g., metal layer, copper layer) in some implementations. The substrate 401 may one of at least silicon, glass, ceramic, and/or dielectric. In some implementations, the metal layers of the lower level metal layers and dielectric layers 402 are configured to provide one or more electrical paths (e.g., routes, interconnects) to one or more circuit elements (not shown) in the integrated device 400.

FIG. 4 also illustrates the integrated device 400 includes a toroid inductor 420. In some implementations, the toroid inductor 420 includes several interconnects that define a set of windings for the toroid inductor 420. As shown in FIG. 4, a portion of the toroid inductor 420 is on the surface of the integrated device 400 (e.g., on surface of the dielectric and/or insulation layer 416).

As shown in FIG. 4 the toroid inductor 420 includes a first interconnect 422, a second set of interconnects 424, a third interconnect 426, a fourth set of interconnects 428, and a fifth interconnect 430. In some implementations the second set of interconnects 424 includes a set of traces and vias (e.g., a first via, a first trace, and a second via). Similarly, in some implementations, the fourth set of interconnects 428 includes a set of traces and vias. (e.g., a third via, a second trace, and a fourth via). In some implementations, the first interconnect 422, the second set of interconnects 424, the third interconnect 426, the fourth set of interconnects 428, and the fifth interconnect 430 are configured to form a set of windings for the toroid inductor 420. In particular, in some implementations, the first interconnect 422, the second set of interconnects 424, the third interconnect 426, the fourth set of interconnects 428, and the fifth interconnect 430 are configured to operate as a toroid inductor. The toroid inductor 420 is coupled to the second pad 425 and the third pad 429. An example of a shape and a configuration of a toroid inductor was described in FIG. 3. In some implementations, to increase the inductance value of the toroid inductor, the thickness of the top metal thickness of the inductor (e.g., interconnects 422, 424, 426, 428 and 430) could be thicker than the UBM 418. In some implementations, the added thickness to the top metal layers of the inductor can be provided and/or added by using ink jet or screen printing.

FIG. 4 illustrates that the toroid inductor 420 is positioned and located in the redistribution layers of the integrated device 400 (e.g., outside of the lower level metal layers and dielectric layers 402). In some implementations, the first interconnect 422, some of the second set of interconnects 424, the third interconnect 426, some of the fourth set of interconnects 428, and the fifth interconnect 430 are on the surface of integrated device 400 (e.g., on surface of insulation layer 416). In some implementations, some of the second set of interconnects 424, and some of the fourth set of interconnects 428 are part of the first redistribution layer 410 and/or the second redistribution layer 414. However, it should be noted that the position and/or the location of the toroid inductor 420 in the integrated device 400 shown in FIG. 4 is merely exemplary and the toroid inductor 420 may be positioned and/or located in different portions of the redistribution layers of the integrated device 400. For example, in some implementations, there may be more than two redistribution layers (e.g., first redistribution layer, second redistribution layer, third redistribution layer). In such instances, the toroid inductor may be positioned and/or located in any of the redistribution layers. Moreover, in some implementations, there may be more than one toroid inductor, or there may be different types and/or combinations of inductors in the redistribution layers of the integrated device 400.

Having described an example of a toroid inductor that is provided in an integrated device that includes one die, another example of a toroid inductor that is provided in a different integrated device will now be described below.

Exemplary Toroid Inductor in an Integrated Device

In some implementations, a toroid inductor may be provided in an integrated device (e.g., semiconductor device) that includes more than one die.

Figure 5:
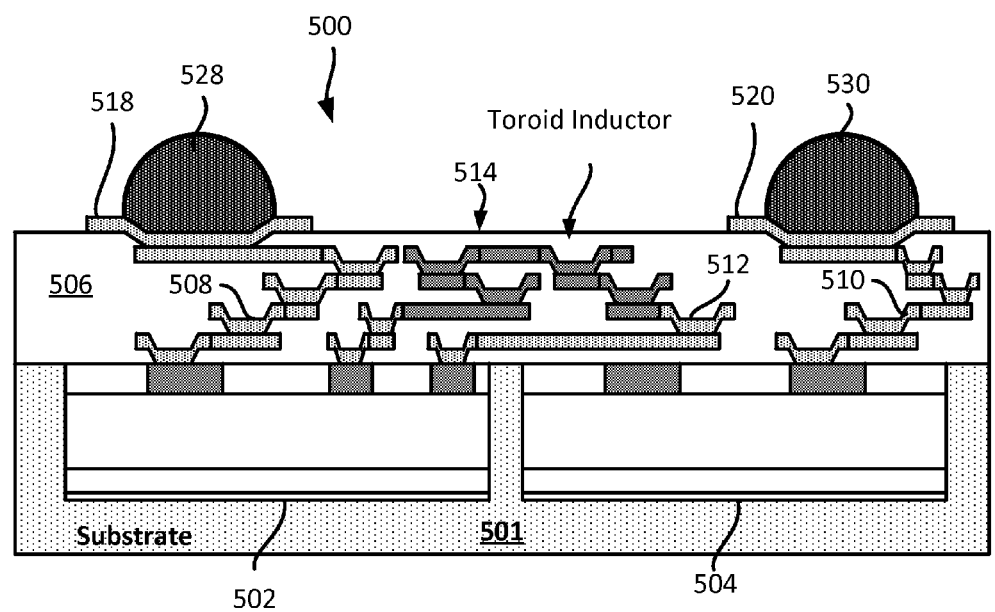
FIG. 5 illustrates an example of a package that includes a toroid inductor.

FIG. 5 conceptually illustrates an integrated device 500 that includes several dies. As shown in FIG. 5, the integrated device 500 (e.g., semiconductor device, package) includes a substrate 501, a first integrated device 502 (e.g., first die), a second integrated device 504 (e.g., second die), a dielectric layer 506, a first set of redistribution layers 508, a second set of redistribution layers 510, a third set of redistribution layers 512, a toroid inductor 514, a first under bump metallization (UBM) layer 518, a second under bump metallization (UBM) layer 520, a first solder ball 528, and a second solder ball 530. In some implementations, the dielectric layer 506, the first set of redistribution layers 508, the second set of redistribution layers 510, the third set of redistribution layers 512, the toroid inductor 514, the first under bump metallization (UBM) layer 518, and the second under bump metallization (UBM) layer 520 are part of a redistribution portion of the integrated device 500.

The substrate 501 may include one of at least silicon, glass, ceramic, and/or dielectric. The first and second integrated devices 502 & 504 (e.g., first and second dies) are located (e.g., embedded) in the substrate 501. In some implementations, the first and second integrated devices 502 & 504 are located in cavities and/or trenches of the substrate 501. An example of a die is further described in FIG. 6.

The first integrated device 502 (e.g., first die) is coupled to the first set of redistribution layers 508. The first set of redistribution layers 508 may include one or more interconnects (e.g., metal layers) and/or one or more vias. The first set of redistribution layers 508 is also coupled to the first UBM layer 518. The first UBM layer 518 is coupled to the first solder ball 528.

The second integrated device 504 (e.g., second die) is coupled to the second set of redistribution layers 510. The second set of redistribution layers 510 may include one or more interconnects (e.g., metal layers) and/or one or more vias. The second set of redistribution layers 510 is also coupled to the second UBM layer 520. The second UBM layer 520 is coupled to the second solder ball 530.

FIG. 5 illustrates that the first integrated device 502 is electrically coupled to the second integrated device 504 through the third set of redistribution layers 512. The third set of redistribution layers 512 may include one or more interconnects (e.g., metal layers) and/or one or more vias.

The first redistribution layers 508, the second redistribution layers 510, and the third redistribution layers 512 are located in the dielectric layer 506. In some implementations, the dielectric layer 506 includes several dielectric layers.

As described above, the integrated device 500 includes a toroid inductor 514. In some implementations, the toroid inductor 514 is coupled to the first set of redistribution layers 508. The toroid inductor 514 is positioned and/or located in the dielectric layer 506. The toroid inductor 514 includes several interconnects that define a set of windings for the toroid inductor 514. In some implementations, the toroid inductor 514 includes one or more redistribution layers. The redistribution layers may include one or more interconnects (e.g., metal layers) and/or one or more vias. The redistribution layers may define a set of windings for the toroid inductor 514. In some implementations, the toroid inductor 514 may have a shape and configuration that is similar to the toroid inductor 300 shown in FIG. 3. A more specific example of a toroid inductor is further described in FIG. 7.

As mentioned above, the first set of redistribution layers 508 is coupled to the first integrated device 502 (e.g., first die), and the second set of redistribution layers 510 is coupled to the second integrated device 504 (e.g., second die).

Figure 6:
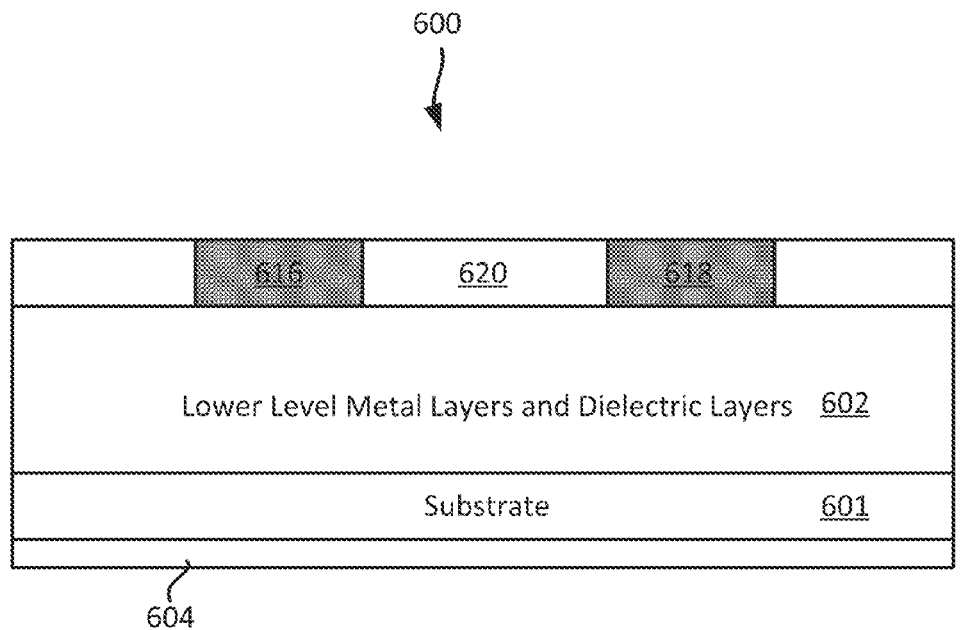
FIG. 6 illustrates an example of a die.

FIG. 6 conceptually illustrates an example of a die 600 (which is a form of an integrated device). For purpose of clarity, FIG. 6 illustrates a generalization of a die. As such, not all the components of a die are shown in FIG. 6. In some implementations, the die 600 may correspond to the first integrated device 502 and/or the second integrated device 504 of FIG. 5. As shown in FIG. 6, the die 600 (e.g., integrated device) includes a substrate 601, several lower level metal layers and dielectric layers 602, an adhesion layer 604 (e.g., oxide layer), a first interconnect 616 (e.g., first bump, first pillar interconnect), a second interconnect 618 (e.g., second bump, second pillar interconnect), and a mold 620. In some implementations, the die 600 may also include pads, a passivation layer, a first insulation layer, a first under bump metallization (UBM) layer, and a second under bump metallization (UBM) layer. In such instances, the pad may be coupled to the lower level metal layers and dielectric layers 602. A passivation layer may be positioned between the lower level metal layers and dielectric layers 602 and the mold 620. A first bump layer may be coupled to the pad and one of the interconnects (e.g., interconnects 616, 618).

The adhesion layer 604 (e.g., oxide layer) is an optional layer that may be added on the backside of the die. In some implementations, the adhesion layer 604 is provided on the substrate 601 by using a plasma process that exposes the substrate 601 to oxygen and/or nitrogen. In some implementations, the adhesion layer 604 (e.g., oxide layer) helps the die 600 bond with another component of an integrated device.

In some implementations, the edges and/or corners of the die 600 may have beveled and/or rounded edges. In some implementations, these beveled and/or rounded edges may be located at the corner/edges of the substrate 601 and/or the adhesion layer 604 (e.g., oxide layer).

Dies are typically manufactured from wafers, which are then cut (e.g., singulate) into individual dies. Different implementations may singulate the wafer into individual dies differently. In some implementations, a combination of a laser and a saw may be used to mechanically cut the wafer into singular dies. However, the saw is subject to mechanical vibration, which makes it difficult to control the position of the saw. As a result, the die size may vary by as much as 10-20 microns (μm) when a mechanical saw is used. In some instances, the thickness of the wafer may be sufficiently thin enough that the wafer may be cut into individual dies by using lithography and etching process (e.g., dry etch). When such lithography and etching processes are used to singulate the wafer, the variation in the die size can be less than 1 microns (μm). This is important because it can ensure that the die size is less than size of the cavity in the substrate.

In some implementations, one or more redistribution layers (e.g., redistribution layers 508) are coupled to the die 600 through the first interconnect 616 and/or the second interconnect 618.

Figure 7:
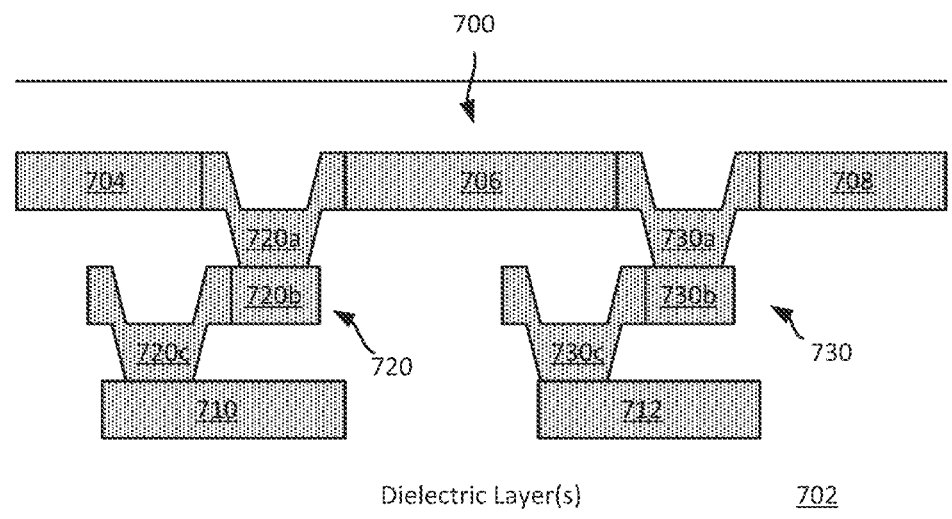
FIG. 7 illustrates a close up view of a toroid inductor in a redistribution layer (RDL) of a package.

FIG. 7 conceptually illustrates a close up view of the toroid inductor of FIG. 5. Specifically, FIG. 7 illustrates a toroid inductor 700 in a dielectric layer 702. In some implementations, the dielectric layer 702 includes several dielectric layers. In some implementations, the toroid inductor 700 corresponds with the toroid inductor 514 of FIG. 5. In some implementations, the toroid inductor 700 may have a shape and configuration that is similar to the toroid inductor 800 shown in FIG. 8. Specifically, the toroid inductor 700 may illustrates the toroid inductor 800 across the cross section AA of FIG. 8.

As shown in FIG. 7, the toroid inductor 700 includes a first interconnect 704, a second interconnect 706, a third interconnect 708, a fourth interconnect 710, a fifth interconnect 712, a sixth set of interconnects 720, and a seventh set of interconnects 730. In some implementations, the first interconnect 704, the second interconnect 706, the third interconnect 708, the fourth interconnect 710, the fifth interconnect 712, the sixth set of interconnects 720, and the seventh set of interconnects 730 are part of one or more redistribution layers of an integrated device (e.g., integrated devices 200, 400, 500, 900). In some implementations, the first interconnect 704, the second interconnect 706, the third interconnect 708, the fourth interconnect 710, the fifth interconnect 712, the sixth set of interconnects 720, and the seventh set of interconnects 730 are configured to operate as a toroid inductor. In some implementations, the interconnects 704 and 708 may represent the terminal of the inductors.

In some implementations, the first, second, and third interconnects 704, 706, and 708 are on a first plane (e.g., first redistribution plane) of a redistribution layer. The second fourth and fifth interconnects 710 and 712 are on a second plane (e.g., second redistribution plane) of a redistribution layer.

FIG. 7 illustrates that the sixth set of interconnects 720, and the seventh set of interconnects 730 include several metal layers. For example, FIG. 7 illustrates that the sixth set of interconnects 720 includes first via 720a (e.g., first via metal layer), an interconnect 720b (e.g., trace, metal layer), and second via 720c (e.g., second via metal layer). FIG. 7 also illustrates that the seventh set of interconnects 730 includes a first via 730a (e.g., first via metal layer), an interconnect 730b (e.g., trace, metal layer), and a second via 730c (e.g., second via metal layer). However, it should be noted that the sixth set of interconnects 720, and the seventh set of interconnects 730 may have a different number of via metal layers (e.g., one via metal layer, two via metal layers, four via metal layers) and/or traces (e.g., metal layers).

Figure 8:
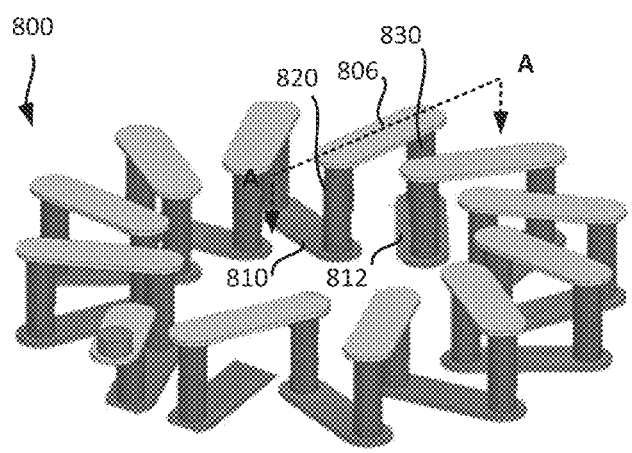
FIG. 8 illustrates an example of an abstract representation of a toroid inductor.

FIG. 8 illustrates a toroid inductor 800 that includes a first interconnect 806, a second interconnect 810, a third interconnect 812, a first via 820, and a second via 830. In some implementations, the interconnects 704, 706 and 708 of FIG. 7 may correspond to the first interconnect 806. In some implementations, the interconnect 710 may correspond to the second interconnect 810. In some implementations, the interconnect 712 may correspond to the third interconnect 812. In some implementations, the sixth set of interconnects 720 may correspond to the first via 820. In some implementations, the seventh set of interconnects 730 may correspond to the second via 830.

In some implementations, the toroid inductor may be positioned and/or located differently in and/or on the dielectric layer of an integrated device. For example, in some implementations, part of the toroid inductor may be on the surface of the dielectric layer of an integrated device.

Figure 9:
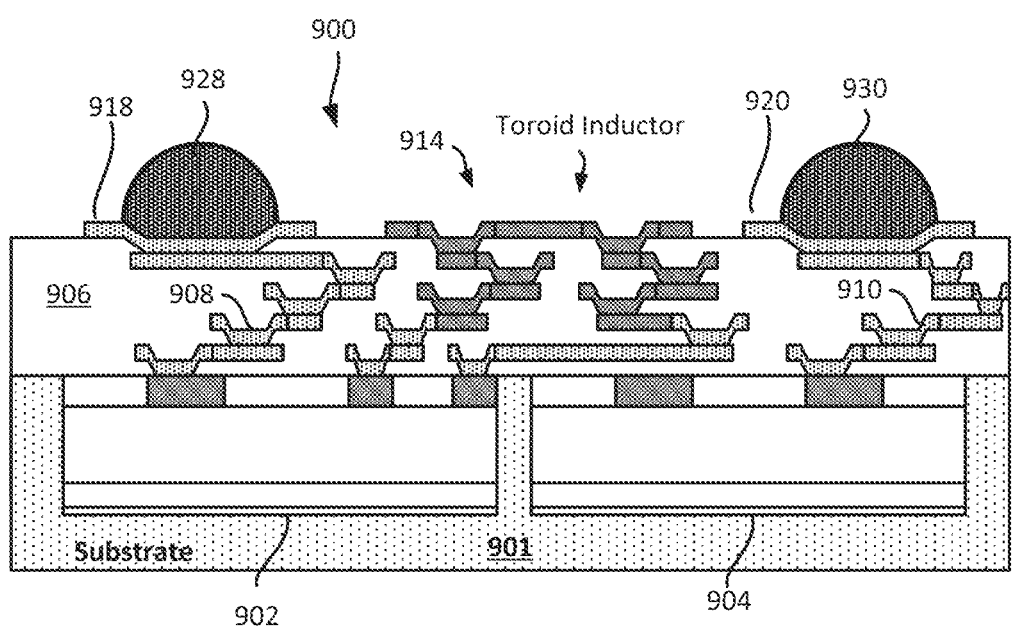
FIG. 9 illustrates another example of a package that includes a toroid inductor.

FIG. 9 conceptually illustrates an integrated device 900 that includes several dies. As shown in FIG. 9, the integrated device 900 (e.g., semiconductor device, package) includes a substrate 901, a first integrated device 902 (e.g., first die), a second integrated device 904 (e.g., second die), a dielectric layer 906, a first set of redistribution layers 908, a second set of redistribution layers 910, a third set of redistribution layers 912, a toroid inductor 914, a first under bump metallization (UBM) layer 918, a second under bump metallization (UBM) layer 920, a first solder ball 928, and a second solder ball 930. In some implementations, a portion of the toroid inductor 914 is on the surface of the dielectric layer 906. In some implementations, the dielectric layer 906, the first set of redistribution layers 908, the second set of redistribution layers 910, the third set of redistribution layers 912, the toroid inductor 914, the first under bump metallization (UBM) layer 918, and the second under bump metallization (UBM) layer 920 are part of a redistribution portion of the integrated device 900.

The substrate 901 may include one of at least silicon, glass, ceramic, and/or dielectric. The first and second integrated devices 902 & 904 (e.g., first and second dies) are located (e.g., embedded) in the substrate 901. In some implementations, the first and second integrated devices 902 & 904 are located in cavities and/or trenches of the substrate 901. An example of a die was described in FIG. 6.

The first integrated device 902 (e.g., first die) is coupled to the first set of redistribution layers 908. The first set of redistribution layers 908 may include one or more interconnects (e.g., metal layers) and/or one or more vias. The first set of redistribution layers 908 is also coupled to the first UBM layer 918. The first UBM layer 918 is coupled to the first solder ball 928.

The second integrated device 904 (e.g., second die) is coupled to the second set of redistribution layers 910. The second set of redistribution layers 910 may include one or more interconnects (e.g., metal layers) and/or one or more vias. The second set of redistribution layers 910 is also coupled to the second UBM layer 920. The second UBM layer 920 is coupled to the second solder ball 930.

FIG. 9 illustrates that the first integrated device 902 is electrically coupled to the second integrated device 904 through the third set of redistribution layers 912. The third set of redistribution layers 912 may include one or more interconnects (e.g., metal layers) and/or one or more vias.

The first redistribution layers 908, the second redistribution layers 910, and the third redistribution layers 912 are located in the dielectric layer 906. In some implementations, the dielectric layer 906 includes several dielectric layers.

As described above, the integrated device 900 includes a toroid inductor 914. In some implementations, a first portion of the toroid inductor 914 is on the surface of the dielectric layer 906. In some implementations, a second portion of the toroid inductor 914 is in the dielectric layer 906.

In some implementations, the toroid inductor 914 is coupled to the first set of redistribution layers 908. The toroid inductor 914 is positioned and/or located in the dielectric layer 906. The toroid inductor 914 includes several interconnects that define a set of windings for the toroid inductor 914. In some implementations, the toroid inductor 914 includes one or more redistribution layers. The redistribution layers may include one or more interconnects (e.g., metal layers) and/or one or more vias. The redistribution layers may define a set of windings for the toroid inductor 914. In some implementations, the toroid inductor 914 may have a shape and configuration that is similar to the toroid inductor 800 shown in FIG. 8 and/or toroid inductor 700 shown in FIG. 7.

Having described several different toroid inductors positioned and/or located in different portions of an integrated device, a sequence for providing/manufacturing a toroid inductor in an integrated device (e.g., semiconductor device) will now be described below.

Figure 10A:
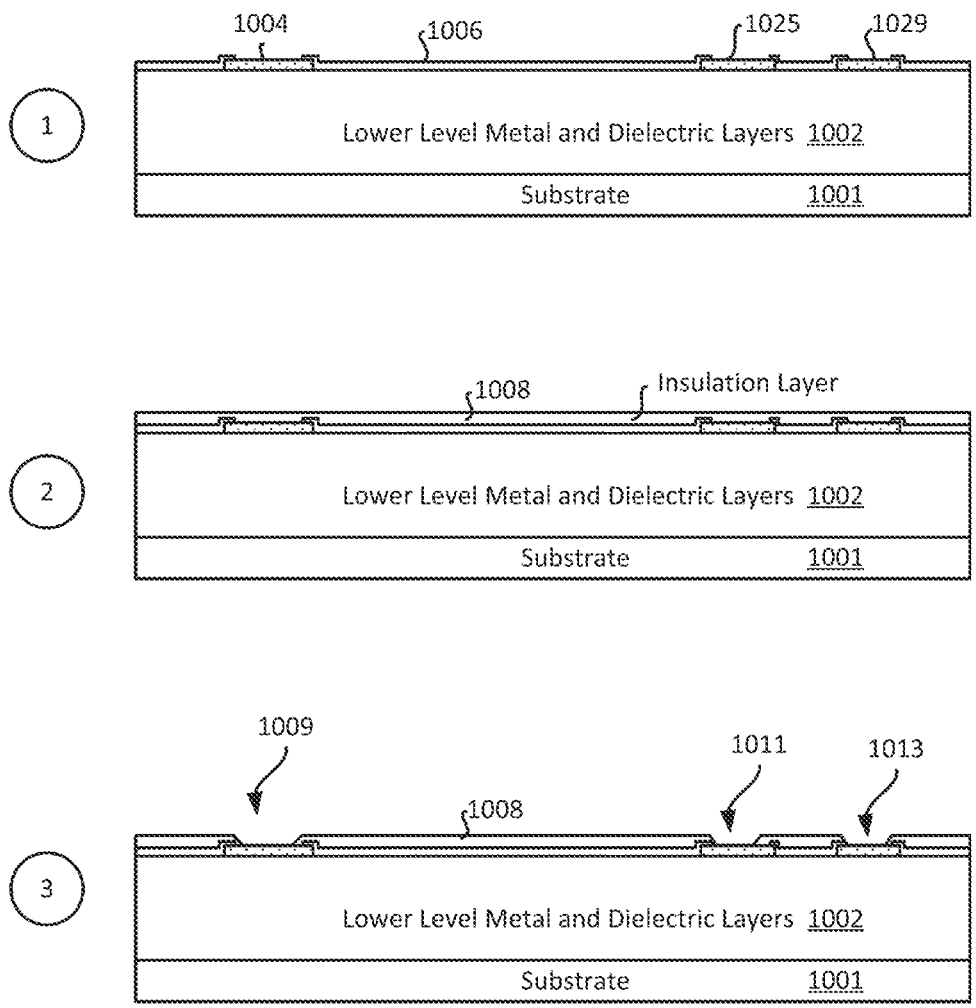
FIG. 10A illustrates part of an exemplary sequence for providing/manufacturing a die that includes a toroid inductor.
Figure 10B:
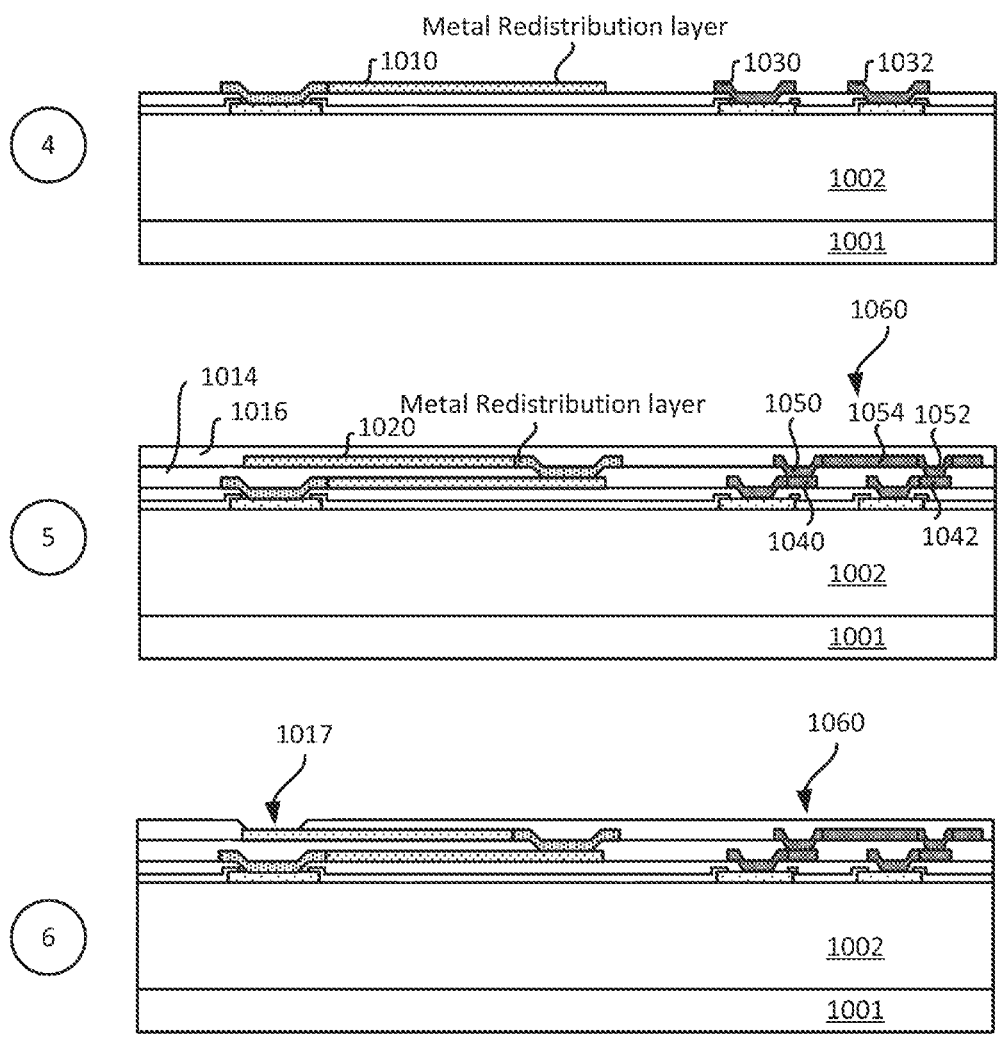
FIG. 10B illustrates part of an exemplary sequence for providing/manufacturing a die that includes a toroid inductor.
Figure 10C:
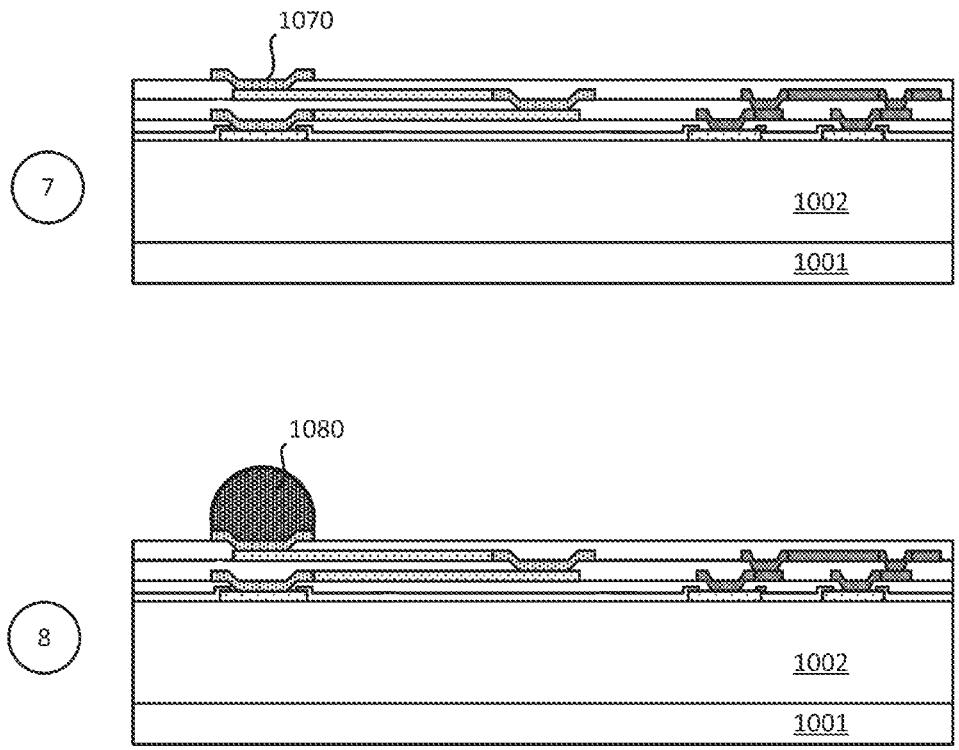
FIG. 10C illustrates part of an exemplary sequence for providing/manufacturing a die that includes a toroid inductor.

Exemplary Sequence for Providing/Manufacturing an Integrated Device that Includes a Toroid Inductor In some implementations, providing an integrated device that includes a toroid inductor includes several processes. FIGS. 10A-10C illustrate an exemplary sequence for providing an integrated device that includes a toroid inductor. In some implementations, the sequence of FIGS. 10A-10C may be used to provide/manufacture the integrated device of FIGS. 2 and/or 4, and/or other integrated devices (e.g., dies) described in the present disclose. It should also be noted that the sequence of FIGS. 10A-10C may be used to provide/manufacture integrated devices that also include circuit elements. It should further be noted that the sequence of FIGS. 10A-10C may combine one or more stages in order to simplify and/or clarify the sequence for providing an integrated device that includes a toroid inductor.

As shown in stage 1 of FIG. 10A, a substrate (e.g., substrate 1001) is provided. In some implementations, the substrate 1001 is a wafer. Different implementations may use different materials for the substrate (e.g., silicon substrate, glass substrate, ceramic substrate).

In addition, at stage 1, several lower level metal layers and dielectric layers (e.g., lower level metal and dielectric layers 1002) are provided on the substrate 1001. Different implementations may provide different number of lower level metal layers and dielectric layers (e.g., M1 metal layer, M2 metal layer, M3 metal layer, M4 metal layer, M5 metal layer, M6 metal layer, M7 metal layer).

In some implementations, circuits, routes and/or interconnects are also provided. However, for the purpose of simplification and clarity, circuits, routes and/or interconnects are not shown in the lower level metal layers and dielectric layers 1002.

Moreover, at stage 1, at least one pad (e.g., pads 1004, 1025, 1029) is provided on the lower level metal layers and dielectric layers 1002. In some implementations, the pad 1004 is coupled to one of the lower level metal layer (e.g., the top lower level metal layer, M7 metal layer). In some implementations, the pad 1004 is an aluminum pad. However, different implementations may use different materials for the pad 1004. Different implementations may use different processes for providing the pad on the lower level metal layers and dielectric layers 1002. For example, in some implementations, a lithography and/or etching process may be use to provide the pad 1004 on the lower level metal layers and dielectric layers 1002.

Additionally, at stage 1, a passivation layer (e.g., passivation layer 1006) is provided on the lower level metal layers and dielectric layers 1002. Different implementations may use different materials for the passivation layer 1006. As shown in stage 4, the passivation layer 1006 is provided on the lower level metal layers and dielectric layers 1002 such that at least a portion of the pad 1004 is exposed.

At stage 2, a first insulation layer (e.g., first insulation layer 1008) is provided on the passivation layer 1006 and the pads 1004, 1025 and 1029. In some implementations, the first insulation layer 1008 is a dielectric layer. Different implementations may use different materials for the first insulation layer 1008. For example, the first insulation layer 1008 may be a Polybenzoxazole (PbO) layer or a polymer layer.

At stage 3, several cavities (e.g., cavity 1209, trench) is provided/created in the first insulation layer 1008. As further shown in stage 3, the cavity 1009 is created over the pad 1004. Similarly, a cavity 1011 is created over the pad 1025, and a cavity 1013 is created over the pad 1029. Different implementations may create the cavities (e.g., cavity 1009) differently. For example, the cavity 1009 may be provided/created by etching the first insulation layer 1008.

At stage 4 of FIG. 10B, a first metal redistribution layer is provided. Specifically, a first metal redistribution layer 1010 is provided over the pad 1004 and the first insulation layer 1008. As shown in stage 4, the first metal redistribution layer 1010 is coupled to the pad 1004. The first metal redistribution layer 1010 also includes a first metal layer 1030 and a second metal layer 1032. That is, in some implementations, the first metal layer 1030 and the second metal layer 1032 is on the same layer as the first metal redistribution layer 1010. In some implementations, the first and second metal layers 1030 and 1032 are vias. In some implementations, the first metal redistribution layer 1010 is a copper layer.

At stage 5, several insulation layers and several redistribution layers are provided. Specifically, a second insulation layer 1014 and a third insulation layer 1016 are provided. Moreover, a second metal redistribution layer 1020 is provided. In addition, several metal layers (1040, 1050, 1042, 1052, 1054) are provided. In some implementations, the metal layers are part of the redistribution layers. In some implementations, some of the metal layers include vias. For example, metal layers 1042, and 1052 are vias and metal layers 1040 and 1050, are traces in some implementations. In some implementations, the metal layers 1040, 1042, 1050, 1052, and 1054 are configured to operate as a toroid inductor 1060.

At stage 6, a cavity 1017 is provided in the insulation layer 1016. The cavity 1017 in the insulation layer 1016 is over a portion of the interconnect 1020.

At stage 7 of FIG. 10C, an under bump metallization (UBM) layer is provided. Specifically, an under bump metallization (UBM) layer 1070 is provided in the cavity 1017 of the insulation layer 1016. In some implementations, the UBM layer 1070 is a copper layer.

At stage 8, a solder ball is provided on the UBM layer. Specifically, a solder ball 1080 is coupled to the UBM layer 1070.

Having described a sequence for providing/manufacturing a toroid inductor in an integrated device (e.g., semiconductor device), a method for providing/manufacturing a toroid inductor in an integrated device (e.g., semiconductor device) will now be described below.

Figure 11:
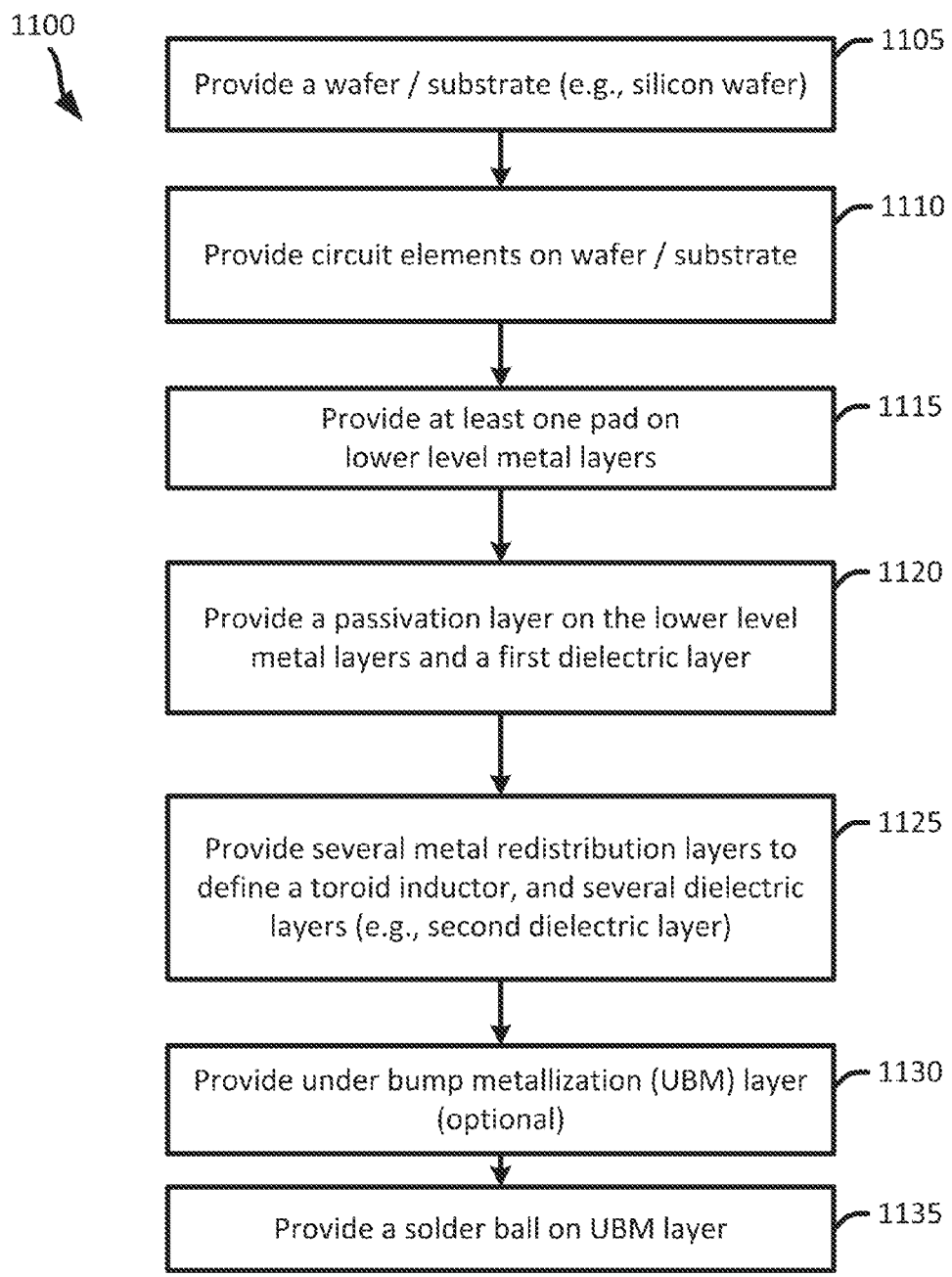
FIG. 11 illustrates an exemplary method for providing/manufacturing a die that includes a toroid inductor.

Exemplary Method for Providing/Manufacturing an Integrated Device That Includes a Toroid Inductor FIG. 11 illustrates an exemplary method for providing an integrated device that includes a toroid inductor. In some implementations, the method of FIG. 11 may be used to provide/manufacture the integrated device of FIGS. 2 and/or 4, and/or other integrated devices (e.g., dies) described in the present disclose.

The method provides (at 1105) a substrate (e.g., substrate 1001). In some implementations, providing (at 1005) the substrate includes providing a wafer (e.g., silicon wafer). However, different implementations may use different materials for the substrate (e.g., glass substrate, silicon substrate, glass substrate). The method then provides (at 1110) circuit elements on the substrate. In some implementations, providing (at 1110) the circuit elements may be bypassed.

The method then provides (at 1115) at least one pad (e.g., pad 1004) on one of the lower level metal layers and dielectric layers (e.g., M7 metal layer). In some implementations, providing (at 1115) the pad includes coupling the pad to one of the lower level metal layer (e.g., the top lower level metal layer, M7 metal layer). In some implementations, the pad is an aluminum pad. However, different implementations may use different materials for the pad. In addition, different implementations may use different processes for providing the pad on the lower level metal layers and dielectric layers. For example, in some implementations, a lithography and/or etching process may be use to provide (at 1115) the pad on the lower level metal and dielectric layers.

The method provides (at 1120) a passivation layer (e.g., passivation layer 1006) on the lower level metal layers and dielectric layers.

The method then provides (at 1125) several metal redistribution layers (e.g., metal redistribution layers 1010, 1030) and dielectric layers (e.g., first insulation layer, second insulation layer). In some implementations, some of the metal redistribution layers are configured to operate as a toroid inductor in the integrated device (e.g., die). Different implementations may use different materials for the dielectric layers. For example, the first and second insulation layers (which are a form of a dielectric layer) may be a Polybenzoxazole (PbO) layer and/or a polymer layer.

The method then optionally provides (at 1130) an under bump metallization (UBM) layer. In some implementations, providing (at 1130) the UBM layer includes coupling the UBM layer to a metal redistribution layer. In some implementations, the UBM layer is a copper layer. The method further provides (at 1135) a solder ball on the UBM layer.

Figure 12A:
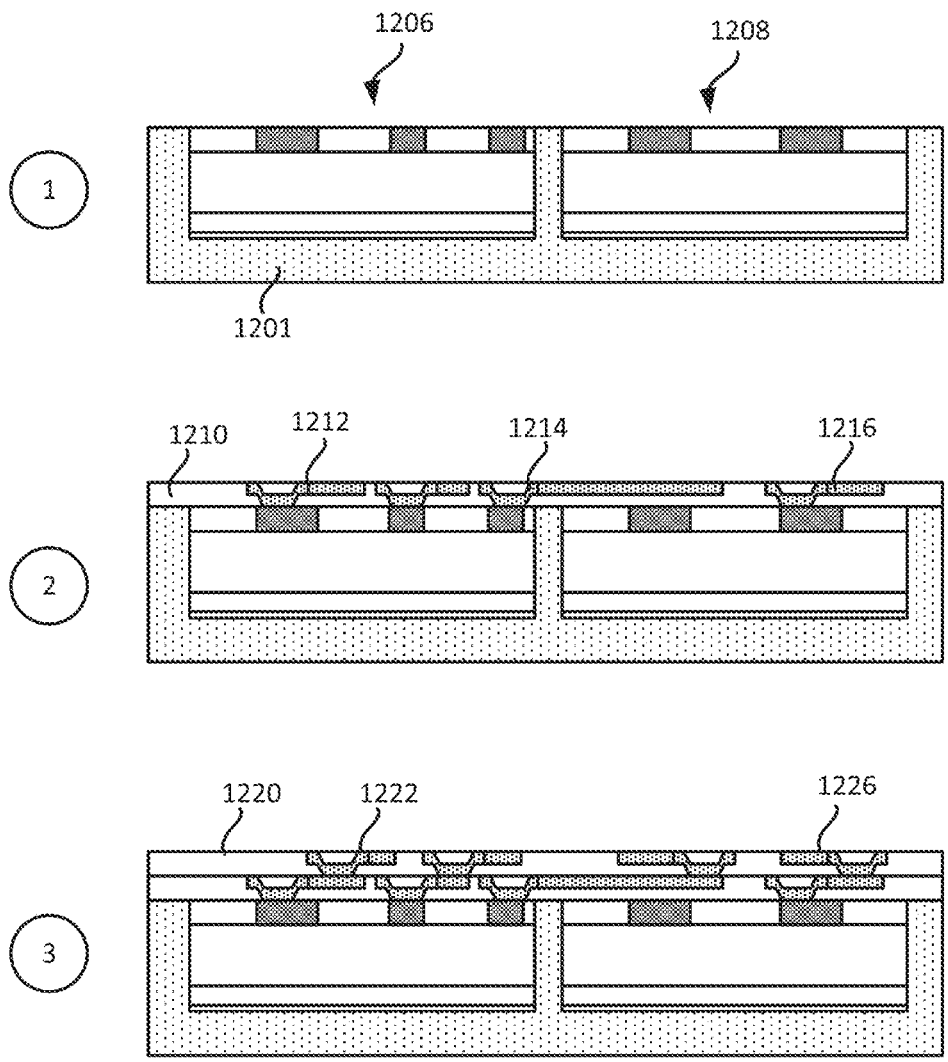
FIG. 12A illustrates part of an exemplary sequence for providing/manufacturing a package that includes a toroid inductor.
Figure 12B:
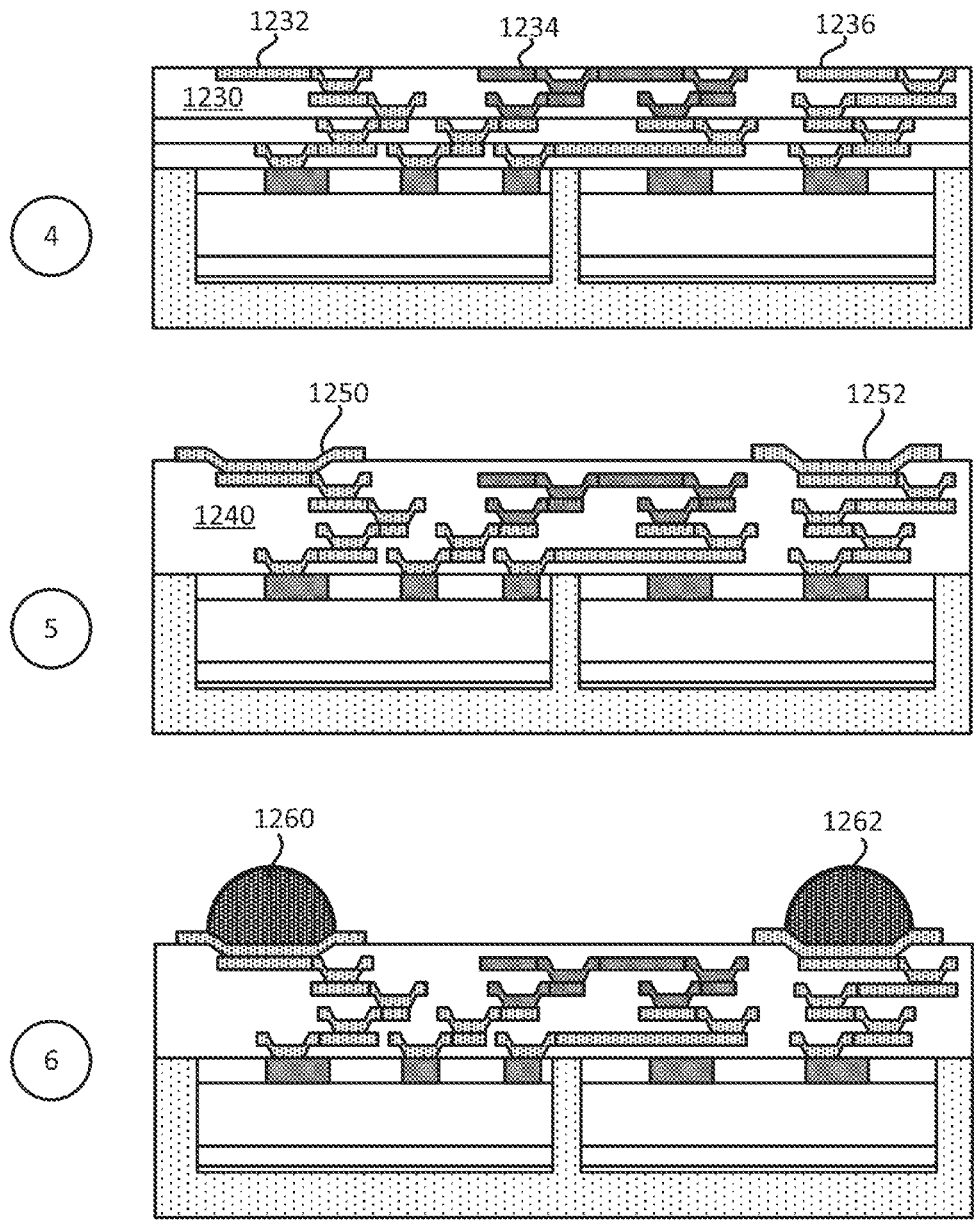
FIG. 12B illustrates part of an exemplary sequence for providing/manufacturing a package that includes a toroid inductor.

Exemplary Sequence for Providing/Manufacturing an Integrated Device that Includes a Toroid Inductor In some implementations, providing an integrated device (e.g., die package) that includes a toroid inductor includes several processes. FIGS. 12A-12B illustrate an exemplary sequence for providing an integrated device that includes a toroid inductor. In some implementations, the sequence of FIGS. 12A-12B may be used to provide/manufacture the integrated device of FIGS. 5 and/or 9, and/or other integrated devices described in the present disclose. It should also be noted that the sequence of FIGS. 12A-12B may be used to provide/manufacture integrated devices that also include circuit elements. It should further be noted that the sequence of FIGS. 12A-12B may combine one or more stages in order to simplify and/or clarify the sequence for providing an integrated device that includes a toroid inductor.

As shown in stage 1 of FIG. 12A, a substrate (e.g., substrate 1201) that includes a first die 1206 and a second die 1208 is provided. In some implementations, the substrate 1201 is a wafer. Different implementations may use different materials for the substrate (e.g., silicon substrate, glass substrate, ceramic substrate). In some implementations, the dies are provided in trenches or cavities of the substrate. Different implementations may provide the trenches in the substrate differently. In some implementations, a laser may be used to provide the trench. In some implementations, an etching (e.g., chemical, mechanical) process may be used to provide the trench. In some implementations, the trench profile could be slopped.

Different implementations may user different integrated devices (e.g., dies). An example of an integrated device (e.g., die) that may be use is die 600, as shown and described in FIG. 6.

At stage 2, a first dielectric layer 1210 (e.g., first insulation layer) and a first metal redistribution layer are provided. The first metal redistribution layer includes a first set of interconnects 1212, a second set of interconnects 1214, and a third set of interconnects 1216.

At stage 3, a second dielectric layer 1220 (e.g., second insulation layer) and a second metal redistribution layer are provided. The second metal redistribution layer includes a fourth set of interconnects 1222 and a fifth set of interconnects 1226.

At stage 4 of FIG. 12B, a third set of dielectric layers 1230 (e.g., third insulation layers) and a third set of metal redistribution layers are provided. The third set of dielectric layers 1230 may includes one or more dielectric layers. The third set of metal redistribution layers includes a seventh set of interconnects 1232, an eight set of interconnects 1234, and a ninth set of interconnects 1236. In some implementations, the interconnects 1232, 1234, and 1236 may include one or more metal layers. In some implementations, stage 4 may represent several stages combined as one. That is, in some implementations, stage 4 may represent several dielectric layers and metal redistribution layers provided sequentially on top of the previous dielectric layer and/or previous metal redistribution layer. In some implementations, an interconnect may include a via. In some implementations, the set of interconnects 1234 is configured to operate as a toroid inductor. In some implementations, the set of interconnects 1234 form a set of windings for a toroid inductor. The set of interconnects 1234 may be similar to the toroid inductors 514, 700, and/or 914.

At stage 5, at least one under bump metallization (UBM) layer is provided. Specifically, a first under bump metallization (UBM) layer 1050 and a second under bump metallization (UBM) layer 1052 are provided. Stage 5 illustrates the set of dielectric layers 1240. In some implementations, the set of dielectric layers 1240 includes the dielectric layers 1210, 1220, and 1230.

At stage 6, at least one solder ball is provided on the UBM layer. Specifically, a first solder ball 1260 is coupled to the first UBM layer 1250, and a second solder ball 1262 is coupled to the second UBM layer 1252.

Having described a sequence for providing/manufacturing a toroid inductor in an integrated device (e.g., semiconductor device), a method for providing/manufacturing a toroid inductor in an integrated device (e.g., semiconductor device) will now be described below.

Figure 13:
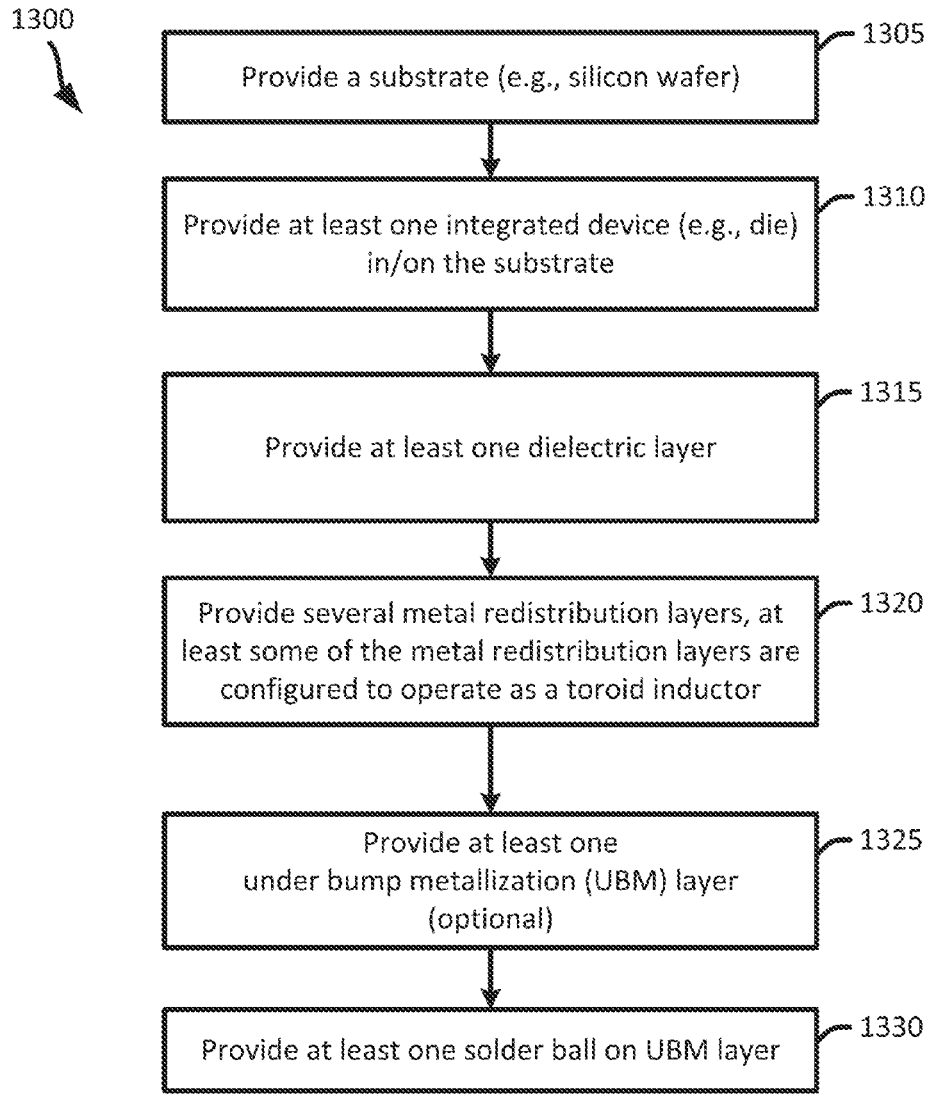
FIG. 13 illustrates an exemplary method for providing/manufacturing a package that includes a toroid inductor.

Exemplary Method for Providing/Manufacturing an Integrated Device that Includes a Toroid Inductor FIG. 13 illustrates an exemplary method for providing an integrated device (e.g., die package) that includes a toroid inductor. In some implementations, the method of FIG. 13 may be used to provide/manufacture the integrated device of FIGS. 5 and/or 8, and/or other integrated devices (e.g., die package) described in the present disclose.

The method provides (at 1305) a substrate (e.g., substrate 1201). In some implementations, providing (at 1305) the substrate includes providing a wafer (e.g., silicon wafer). However, different implementations may use different materials for the substrate (e.g., glass substrate, silicon substrate, glass substrate). In some implementations, providing the substrate may also include providing (e.g., manufacturing) one or more trenches in the substrate. In some implementations, the substrate that is provided (at 1305) includes one or more trenches.

The method then provides (at 1310) at least one integrated device (e.g., die) in or/and on the substrate. In some implementations, an integrated device (e.g., die) may be provided in a trench of the substrate.

The method further provides (at 1315) at least one dielectric layer (e.g., dielectric layers 1210, 1220, 1230, 1240). Different implementations may use different materials for the dielectric layers. For example, first and second insulation layers (which are a form of a dielectric layer) may be a Polybenzoxazole (PbO) layer and/or a polymer layer.

The method also provides (at 1320) several metal redistribution layers. In some implementations, at least some of the redistribution layers are configured to operate as a toroid inductor.

It should be noted that in some implementations, the method of providing (at 1315) at least one dielectric layer, and providing (at 1320) the metal redistribution layers may be performed sequentially back and forth. That is, in some implementations, the method may provide a first dielectric layer, a first redistribution layer, a second dielectric layer, a second redistribution layer, and so on and so forth.

The method then optionally provides (at 1325) an under bump metallization (UBM) layer. In some implementations, providing (at 1325) the UBM layer includes coupling the UBM layer to a metal redistribution layer. In some implementations, the UBM layer is a copper layer. The method further provides (at 1330) a solder ball on the UBM layer.

Exemplary Electronic Devices

Figure 14:
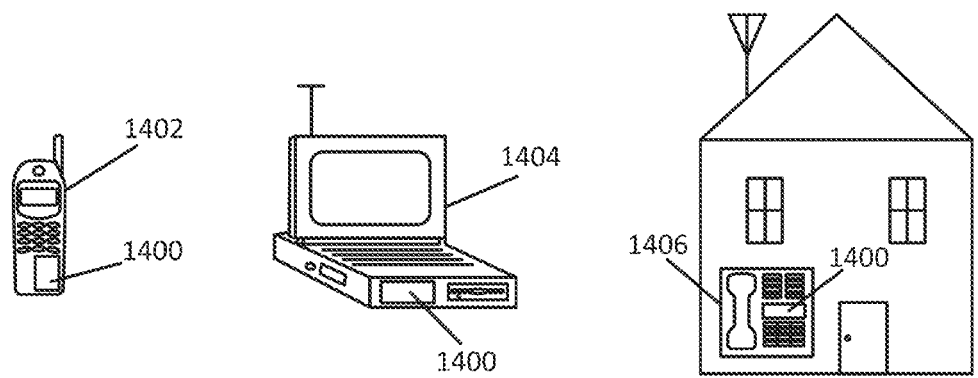
FIG. 14 illustrates various electronic devices that may integrate a semiconductor device, a die, an integrated circuit and/or PCB described herein.

FIG. 14 illustrates various electronic devices that may be integrated with any of the aforementioned semiconductor device, integrated circuit, die, interposer or package. For example, a mobile telephone 1402, a laptop computer 1404, and a fixed location terminal 1406 may include an integrated circuit (IC) 1400 as described herein. The IC 1400 may be, for example, any of the integrated circuits, dice or packages described herein. The devices 1402, 1404, 1406 illustrated in FIG. 14 are merely exemplary. Other electronic devices may also feature the IC 1400 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3, 4, 5, 6, 7, 8, 9, 10A-10C, 11, 12A-12B, 13 and/or 14 may be rearranged and/or combined into a single component, step, feature or function or embodied in several components, steps, or functions. Additional elements, components, steps, and/or functions may also be added without departing from the invention. It should also be noted that FIGS. 2, 3, 4, 5, 6, 7, 8, 9, 10A-10C, 11, 12A-12B, 13 and/or 14 and its corresponding description in the present disclosure is not limited to dies and/or ICs. In some implementations, 2, 3, 4, 5, 6, 7, 8, 9, 10A-10C, 11, 12A-12B, 13 and/or 14 and its corresponding description may be used to manufacture, create, provide, and/or produce integrated devices. In some an integrated device may include a die, a die package, an integrated circuit (IC), a wafer, a semiconductor device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device comprising:
   a substrate;
   a plurality of metal layers coupled to the substrate;
   a plurality of dielectric layers coupled to the substrate; and
   a redistribution portion coupled to one of the metal layers,
      the redistribution portion comprising:
      a first metal redistribution layer; and
      a second metal redistribution layer coupled to the first metal redistribution layer,
   wherein the first and second metal redistribution layers are configured to operate as a toroid inductor in the integrated device.

2. The integrated device of claim 1, wherein the redistribution portion comprises a third metal redistribution layer, wherein the third metal redistribution layer is coupled to the first and second metal redistribution layers, the third metal redistribution layer being a via.

3. The integrated device of claim 2, wherein the first, second, and third metal redistribution layers are configured to operate as a toroid inductor in the integrated device.

4. The integrated device of claim 2, wherein the first, second, and third redistribution layers form a set of windings for the toroid inductor.

5. The integrated device of claim 1, wherein the redistribution portion further comprises a first dielectric layer, and a second dielectric layer.

6. The integrated device of claim 5, wherein the second metal redistribution layer is on a surface of the integrated device.

7. The integrated device of claim 1, further comprising a first die coupled to the substrate.

8. The integrated device of claim 7, wherein the redistribution portion is coupled to the first die and the substrate.

9. The integrated device of claim 1, wherein the integrated device is one of at least a die and/or a die package.

10. The integrated device of claim 1, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

11. An apparatus comprising:
    a substrate;
    a plurality of metal layers coupled to the substrate;
    a plurality of dielectric layers coupled to the substrate; and
    a redistribution portion coupled to one of the metal layers,
       the redistribution portion comprising:
       a first interconnect means; and
       a second interconnect means coupled to the first interconnect means, wherein the first and second metal interconnect means are configured to operate as a toroid inductor in the apparatus.

12. The apparatus of claim 11, wherein the redistribution portion further comprises a third interconnect means, wherein the third interconnect means is coupled to the first and second interconnect means, the third interconnect means being a via.

13. The apparatus of claim 12, wherein the first, second, and third interconnect means are configured to operate as a toroid inductor in the apparatus.

14. The apparatus of claim 12, wherein the first, second, and third interconnect means form a set of windings for the toroid inductor.

15. The apparatus of claim 11, wherein the redistribution portion further comprises a first dielectric layer, and a second dielectric layer.

16. The apparatus of claim 15, wherein the second interconnect means is on a surface of the apparatus.

17. The apparatus of claim 11, further comprising a first die coupled to the substrate.

18. The apparatus of claim 17, wherein the redistribution portion is coupled to the first die and the substrate.

19. The apparatus of claim 11, wherein the apparatus is one of at least an integrated device, die and/or a die package.

20. The apparatus of claim 11, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

* * * * *